(12) United States Patent
Kato et al.

(10) Patent No.: US 7,268,952 B2
(45) Date of Patent: Sep. 11, 2007

(54) CATADIOPTRIC PROJECTION SYSTEM, AND EXPOSURE APPARATUS HAVING THE SAME

(75) Inventors: Takashi Kato, Utsunomiya (JP); Chiaki Terasawa, Nasugun (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 11/271,665

(22) Filed: Nov. 10, 2005

(65) Prior Publication Data

US 2006/0098298 A1    May 11, 2006

(30) Foreign Application Priority Data

Nov. 10, 2004   (JP)   .............................. 2004-326615

(51) Int. Cl.
G02B 3/00 (2006.01)
(52) U.S. Cl. ...................................... 359/649; 359/650
(58) Field of Classification Search ......... 359/649–651
See application file for complete search history.

(56) References Cited

U.S. PATENT DOCUMENTS

| | | | | |
|---|---|---|---|---|
| 4,854,688 A | * | 8/1989 | Hayford et al. ............. | 359/433 |
| 5,861,997 A | * | 1/1999 | Takahashi ................... | 359/727 |
| 6,157,498 A | * | 12/2000 | Takahashi ................... | 359/728 |
| 2004/0160677 A1 | * | 8/2004 | Epple et al. ................ | 359/649 |
| 2004/0233405 A1 | | 11/2004 | Kato et al. | |
| 2005/0117224 A1 | | 6/2005 | Shafer et al. | |
| 2006/0028715 A1 | * | 2/2006 | Kato et al. .................. | 359/365 |
| 2006/0109560 A1 | * | 5/2006 | Kamenov et al. ........... | 359/649 |
| 2006/0221456 A1 | * | 10/2006 | Shafer et al. ............... | 359/649 |

FOREIGN PATENT DOCUMENTS

| | | |
|---|---|---|
| JP | 8-62502 | 3/1996 |
| JP | 2003-307679 | 10/2003 |
| JP | 2004-205698 | 7/2004 |
| JP | 2004-227364 | 8/2004 |
| JP | 2004-305248 | 11/2004 |

* cited by examiner

Primary Examiner—Jordan Schwartz
Assistant Examiner—James C Jones
(74) Attorney, Agent, or Firm—Morgan & Finnegan, LLP

(57) ABSTRACT

A catadioptric projection system for forming an intermediate image of a first object plural times, and images the intermediate image onto a second object includes at least two deflective reflectors, a lens unit arranged in an optical path between the two deflective reflectors, the lens unit having a negative refractive power, and not forming a reciprocating optical system that passes incident light and reflected light.

13 Claims, 9 Drawing Sheets

CATADIOPTRIC PROJECTION SYSTEM, AND EXPOSURE APPARATUS HAVING THE SAME

BACKGROUND OF THE INVENTION

The present invention relates generally to a projection optical system, and more particularly to a catadioptric projection system that uses a mirror to project a pattern onto a substrate, such as a single crystal substrate for a semiconductor wafer, and a glass plate for a liquid crystal display ("LCD"). The present invention is suitable, for example, for a so-called immersion exposure apparatus that immerses the final surface of the projection optical system and the surface of the substrate in the fluid or liquid, and exposes the substrate via the fluid.

A reduction projection exposure apparatus has been conventionally employed which uses a projection optical system to project a circuit pattern of a mask (reticle) onto a wafer, etc. to transfer the circuit pattern, in manufacturing such a fine semiconductor device as a semiconductor memory and a logic circuit in the photolithography technology. As the high integration of the semiconductor device proceeds, the demand for the specification and performance of the projection optical system becomes stricter. In general, use of the exposure light having a shorter wavelength and a projection optical system having a higher numerical aperture ("NA") are effective to high resolution. More recently, a further high NA scheme proceeds as seen in an optical system having a NA greater than 1 has been proposed, such as a so-called immersion exposure apparatus that fills a space between the final glass surface (or a lens closest to the wafer) of the projection optical system and the wafer with fluid.

When use of the exposure light having a shorter wavelength advances to such a wave range as the ArF excimer laser (having a wavelength of about 193 nm) and the $F_2$ laser (having a wavelength of about 157 nm), the usable glass material is limited to quartz and calcium fluoride ($CaF_2$) so as to maintain the predetermined transmittance. A dioptric optical system generally uses quartz and calcium fluoride for the exposure wavelength, for example, of 193 nm. However, these materials do not have a great difference of dispersion, and it is very difficult to correct the chromatic aberration of the optical system having a very high NA like an immersion optical system. In addition, as the NA becomes higher, an aperture of the glass material becomes large, increasing the cost of the apparatus.

Accordingly, various proposals that include a mirror in the optical system have been made to avoid problems, such as the transmittance, the chromatic aberration and a large aperture of the glass material. For example, a catadioptric projection system that combines a reflection optical system and a refractive optical system is disclosed in Japanese Patent Applications, Publication Nos. ("JPs") 2004-205698, 8-62502 (corresponding to U.S. Pat. No. 5,861,997) and 2003-307679.

In forming a projection optical system that includes a reflection optical system for the exposure light having a short wavelength and a high NA, an optical system that has a correctable chromatic aberration, provides a sufficiently large imaging area, and is compatible with a higher NA. In particular, the NA greater than about 1.1 causes a long distance between an object (or reticle) and an image (or wafer) and a large effective diameter of the glass material, and the large size of the optical system and the high cost of the apparatus are inevitable. In addition, as the high NA advances, the tolerance to each of various aberrations, such as a distortion, becomes stricter.

JP 2004-205698 discloses a catadioptric optical system as a twice-imaging system that forms an intermediate image once. It includes a reciprocating optical system that has a concave mirror, a first imaging optical system that forms an intermediate image of the first object (or reticle), a second imaging optical system that images an intermediate image on a second object (or wafer). A first plane mirror is provided to deflect the light and optical axis near the intermediate image. The optical axis deflected by the first plane mirror is deflected approximately parallel to the reticle stage, again deflected by a second plane mirror, and imaged onto a second object. It is inevitable in the optical system disclosed in JP 2004-205698 due to the above configuration that the reticle surface, the lens, the plane mirror, and the deflected light are arranged close to each other. Therefore, the interference among the reticle surface, the reticle stage, the lens and the plane mirror becomes problematic, and it is difficult to maintain a sufficient space. In addition, FIG. 5 in JP 2004-205698 shows an immersion optical system having an NA of 1.05 and a maximum effective diameter greater than Φ300. If the high NA of 1.2 or greater is sought, the maximum effective diameter becomes very large.

FIGS. 7 and 9 of JP 8-62502 shows a catadioptric optical system as a three-time imaging system that forms an intermediate twice and has an NA between about 0.45 and about 0.5. It includes a first imaging optical system that forms a first intermediate image, a second imaging optical system that forms a second intermediate image from the first intermediate image and has a concave mirror, and a third imaging optical system that images the second intermediate image on the wafer surface. The second imaging optical system forms a reciprocating optical system having a concave mirror. In this optical system, the reticle is not parallel to the wafer. The first and second objects that are perpendicular to the gravity and parallel to each other enhance the imaging performance in a scanning exposure, and maintain the stable performance. Therefore, this optical system is unsuitable for the immersion exposure apparatus since the reticle is not parallel to the wafer, and it is difficult to retain the fluid. This optical system may need another plane mirror to arrange the reticle and the wafer in parallel. If the plane mirror is arranged near the first intermediate image, as in JP 8-62502, the optical system has a similar configuration to FIGS. 4 and 6 in JP 2003-307679.

FIG. 4 of JP 2003-307679 shows an optical system having an NA of about 0.85, arranges a plane mirror (or a reflective block) near the first and second intermediate images, accords the optical axes of the first and third imaging optical systems with each other, and arranges the reticle and wafer parallel to each other. However, this optical system becomes very large when the NA becomes 1 or greater, in particular, NA becomes 1.1 or greater, as in the immersion optical system, because the first imaging optical system from the reticle approximately to the plane mirror and the third imaging optical system approximately from the plane mirror to the wafer are arrange on the same line or optical axis. More specifically, a sum of the object-to-image distance in the first optical system and the object-to-image distance in the third optical system becomes the object-to-image distance in the entire optical system (or a distance between the reticle and the wafer). In order to prevent a large size of the optical system as the high NA advances, the refractive force of each lens should be made stronger and the aberrational correction becomes difficult. In addition, since the first imaging optical system increases a reduction ratio, the NA of the first intermediate image becomes larger by the reduction ratio than the object-side NA of the reticle. As a result, the incident angle range and the maximum incident angle upon the plane mirror increase, and pose a serious problem to the higher NA than 1. In other word, the higher NA than 1 excessively increases the incident angle range and the maximum incident angle upon the plane mirror, deteriorating the imaging performance due to the aggravated film characteristic of the plane mirror. This is true of the second intermediate image since the plane mirror is also provided near the second intermediate image.

BRIEF SUMMARY OF THE INVENTION

The present invention is directed to a catadioptric projection system and an exposure apparatus that shortens a distance between a first object (such as a reticle) and a second object (such as a wafer), and provides excellent imaging performance.

A catadioptric projection system according to one aspect of the present invention for forming an intermediate image of a first object plural times, and images the intermediate image onto a second object includes at least two deflective reflectors, a lens unit arranged in an optical path between the two deflective reflectors, the lens unit having a negative refractive power, and not forming a reciprocating optical system that passes incident light and reflected light.

A catadioptric projection system according to another aspect of the present invention that serves as a three-time imaging system for forming an intermediate image of a first object plural times, and images the intermediate image onto a second object includes, in order from the first object side, a first lens unit that does not form a reciprocating optical system that passes incident light and reflected light, a catadioptric unit that forms a reciprocating optical system, a second lens unit that dos not form the reciprocating optical system, at least two deflective reflectors, and a third lens unit arranged in an optical path between the two deflective reflectors, the lens unit having a negative refractive power, and not forming the reciprocating optical system, wherein the catadioptric unit includes a fourth lens unit and a concave mirror, and wherein the two deflective reflectors are arranged in the optical path between the concave mirror and the second lens unit.

An exposure apparatus according to another aspect of the present invention includes the above catadioptric projection system, a reticle stage for holding a reticle so as to position a pattern of the reticle on the first object, a wafer stage for holding an object so as to position a photosensitive layer on the second object, and a scan unit that synchronously scans the reticle stage and the wafer stage while the reticle is illuminated.

An exposure apparatus according to still another aspect of the present invention includes an illumination optical system for illuminating a pattern with light from a light source, and the above catadioptric projection system for projecting the light from the pattern onto an object.

A device manufacturing method according to still another aspect of the present invention includes the steps of exposing an object to be exposed using the above exposure apparatus, and developing the object exposed.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Figure 1:
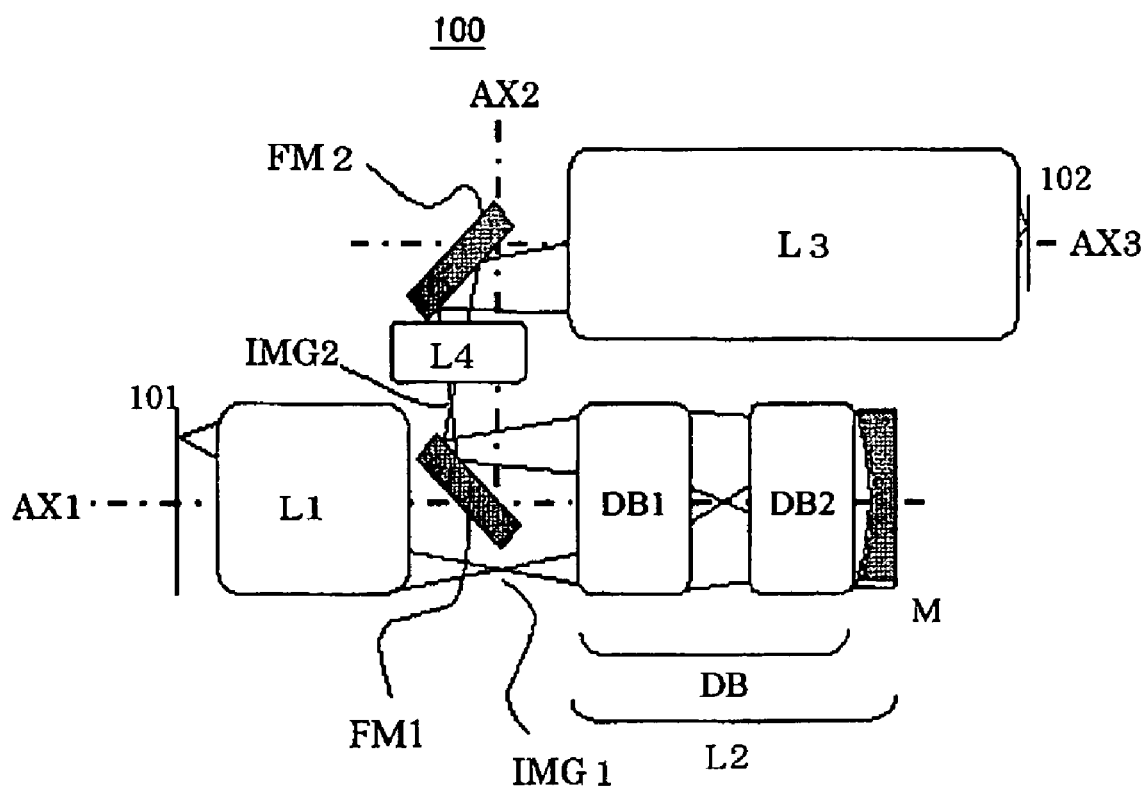
FIG. 1 is a schematic sectional view showing a structure of a catadioptric projection system according to one aspect of the present invention.

With reference to the accompanying drawings, a description will be given of a catadioptric projection system 100 according to one aspect of the present invention. In each figure, the same reference numeral denotes the same element and a duplicate description thereof will be omitted. A term "lens unit" in this application covers a single lens as well as plural lenses. Here, FIG. 1 is a schematic sectional view showing a structure of a catadioptric projection system 100.

Referring to FIG. 1., 101 denotes a first object (such as a reticle) and 102 a second object (such as a wafer). AX1 to AX3 are optical axes of optical systems. The catadioptric projection system 100 is a three-times imaging system that forms an intermediate (or real) image twice. The catadioptric projection system 100 includes, in order from the first object 101 side, a first imaging optical system, a second imaging optical system, and a third imaging optical system.

The first imaging optical system forms an image of the first object 101 or a first intermediate image IMG1, and the second imaging optical system, which includes a concave mirror M forms a second intermediate image IMG2 as the real image from the light from the first intermediate image IMG1. The third imaging optical system forms a real image of the intermediate image IMG2 onto the second object 102. The projection optical system 100 provides an optical system that images the off-axis light without shielding the light at the center of the pupil. In this embodiment, the projection optical system 100 is an immersion optical system that fills a space with fluid between the second object 102 and a final lens surface closest to the second object 102. The final lens surface may have a thin film.

The projection optical system 100 includes at least two deflective reflectors in FIG. 1 or the first and second deflective reflectors FM1 and FM2, and a third lens unit L4 having a negative refractive power in the optical path between the first and second deflective reflectors FM1 and FM2. An arrangement of the lens unit L4 having a negative refractive power enables distortion etc. to be particularly effectively corrected, and the maximum incident angle of the light upon the second deflective reflector FM2 to be small in FIG. 1.

More specifically, the projection optical system 100 includes, in order from the first object 101 side, a first lens unit L1, a catadioptric unit L2, a third lens unit L4, and a second lens unit L3. The first lens unit L1 includes at least one lens, and does not form a reciprocating optical system. The catadioptric unit L2 includes at least one lens, and forms a reciprocating optical system. The third lens unit L4 includes at least one lens, and does not form a reciprocating optical system. The second lens unit L3 has at least one lens, and does not form a reciprocating optical system. The catadioptric unit L2 includes a fourth lens unit DB for forming the reciprocating optical system, and a concave mirror M.

The projection optical system 100 includes at least two deflective reflectors or the first and second deflective reflectors FM1 and FM2 in the optical path between the concave mirror M and the lens unit L3. More specifically, the first and second deflective reflectors FM1 and FM2 are arranged in the optical path between the catadioptric unit L2 and the lens unit L3.

The lens unit L4 having a negative refractive power is arranged in the optical path between the first and second deflective reflectors FM1 and FM2.

The first deflective reflector FM1 deflects an optical axis AX1 into an optical axis AX2, as shown in FIG. 1, and deflects the light from the first object 101. The second deflective reflector FM2 deflects the optical axis AX2 into an optical axis AX3.

The first object 101 and the second object 102 are arranged in parallel. The concave mirror M opposes to the first object 101. The optical axis AX2 is arranged orthogonal to the respective normals of the first and second objects 101 and 102. However, the optical axis AX2 does not have to be orthogonal to the optical axes AX1 and AX3, because as long as the optical axes AX1 and AX3 are parallel to each other, the first and second objects 101 and 102 are arranged in parallel. In other words, it is sufficient that the respective normals of the first and second deflective reflectors FM1 and FM2 concave mirror M form 90° substantially.

The lens unit DB that forms the reciprocating optical system includes a fifth lens unit DB1 having a positive refractive power and a sixth lens unit DB2 having a negative refractive power, and they are preferably arranged in order from the concave mirror M of the lens unit DB2 and the lens unit DB1. An arrangement of the lens unit DB2 having a negative power just before the concave mirror M can enhance the refractive power of the concave mirror M. The lens unit DB2 and the concave mirror M increase a negative Petzval sum, and effectively cancel the positive Petzval sum that occurred in other lens units.

The lens unit DB1 having a positive refractive power can restrain the maximum incident angle of the light upon the first and second deflective reflectors FM1 and FM2. The lens unit DB1 having a positive refractive power includes at least one lens having a positive refractive power. The lens unit DB2 having a negative refractive power includes at least one lens having a negative refractive power.

The lens unit DB preferably has at least one lens having an aspheric surface. When there is no lens having an aspheric surface, the lens unit DB in the reciprocating optical system preferably includes plural lenses to distribute the refractive power. Even when the aspheric lens is used, the lens unit DB preferably has plural lenses to restrain a generation of the aberration in the reciprocating optical system and effectively correct the aberration that occurs in other lens units. The concave mirror M may be an aspheric surface.

The second intermediate image IMG2 is preferably formed between the first and second deflective reflectors FM1 and FM2, because this configuration can restrain the effective diameters of two deflective reflectors and the lens arranged near them. In addition, a distance between the first object 101 and the second object 102 or object-to-image distance can be effectively shortened. The second intermediate image IMG2 may be formed between the lens unit L4 and the first deflective reflector FM1, between the lens unit L4 and the second deflective reflector FM2, or the lens unit L4.

The first intermediate image IMG1 is preferably formed between the lens unit L1 and the lens unit DB2, because this configuration easily split the light directing from the lens unit L1 to the concave mirror M from the first deflective reflector FM1.

Thus, the projection optical system 100 is a three-times imaging system, and includes at least two deflective reflectors (first and second deflective reflectors FM1 and FM2), and the concave mirror M. By arranging the lens unit L4 having a negative refractive power between two deflective reflectors, the three-time imaging system compatible with a high NA can reduce the object-to-image distance and the effective diameter, and effectively correct various aberrations, such as distortion. In addition, the off-axis light can be imaged without shielding the light at the center part in the pupil.

In the projection optical system 100, the first imaging optical system includes the lens unit L1, the second imaging optical system includes the lens unit DB2 having a negative refractive power and the concave mirror M, and the third imaging optical system includes lens unit L3. The first imaging optical system has a pupil in the lens unit L1, while the third imaging optical system has a pupil in the lens unit L3. These pupils have different positions on the optical axis.

Figure 2:
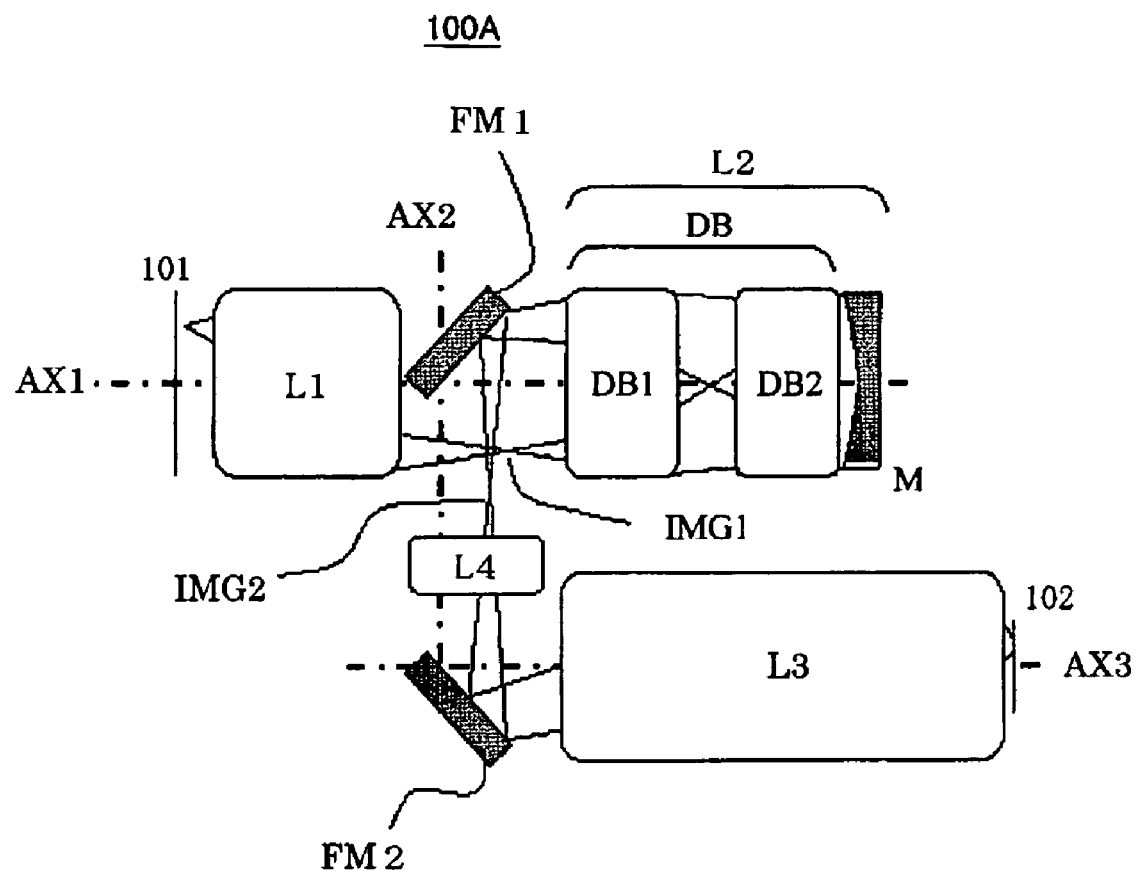
FIG. 2 is a schematic sectional view of a variation of the catadioptric projection system shown in FIG. 1.

The projection optical system 100 is not limited to the configuration shown in FIG. 1 and may be configured as shown in FIG. 2. FIG. 2 is a schematic sectional view showing a structure of a projection optical systems 100A. The projection optical system 100A shown in FIG. 2 is different from the projection optical system 100 shown in FIG. 1 in that the first deflective reflector FM1 is arranged so that the light directing from the lens unit L1 to the concave mirror M intersects with the light reflected on the concave mirror M.

In the projection optical systems 100 and 100A, each optical axis of an optical element having a refractive index except for the lens unit L4 having a negative refractive power faces approximately the gravity direction. The projection optical systems 100 and 100A preferably meet Equations 1 and 2 below (where reference numeral 100 generalizes 100A etc. unless otherwise specified):

$$4.0<|\beta L1/\oplus|<24.0 \qquad \text{[EQUATION 1]}$$

$$0.05<|\beta L3 \times NA|<0.25 \qquad \text{[EQUATION 2]}$$

Equation 1 defines a ratio between the paraxial magnification $\beta L1$ of the lens unit L1 and the paraxial magnification $\beta$ of the overall system. When the ratio becomes lower than the lower limit of Equation 1, it is difficult to avoid interference between the light directing from the lens unit L1 to the concave mirror M and the light directing from the concave mirror M to the first deflective reflector FM1. On the other hand, when the ratio becomes higher than the upper limit of Equation 1, the first intermediate image IMG1 becomes larger and thus an effective diameter of the neighboring lens becomes larger. As a result, the other imaging optical systems undesirably bear heavier burdens of the reduction ratio.

Equation 2 defines a product between the paraxial magnification βL3 of the lens unit L3 and the NA of the overall system on the side of the second object 101. When the product becomes lower than the lower limit of Equation 2, the light incident upon the first and second deflective reflectors FM1 and FM2 becomes excessively narrow. In other words, the paraxial magnification βL3 of the lens unit L3 becomes so small that the deflective reflector and the effective diameter of the lens near the second intermediate image IMG2 are so large and it is difficult to correct the aberration. In addition, a distance between the second deflective reflector FM2 and the second object 102 undesirably becomes excessively large. On the other hand, when the product becomes higher than the upper limit of Equation 2, the light incident upon the first and second deflective reflectors FM1 and FM2 becomes excessively wide, and it is difficult to design a film that optimizes the film characteristic of the second deflective reflector FM2, consequently deteriorating the imaging performance. In particular, this problem is remarkable in the optical system that has the NA greater than 1 like an immersion optical system.

It is more preferably that the ratio between the paraxial magnification βL1 of the lens unit L1 and the paraxial magnification β of the overall system and the product between the paraxial magnification βL3 of the lens unit L3 and the NA of the overall system on the side of the second object 101 meet Equations 3 and 4 below:

$$6.0 < |\beta L1/\beta| < 20.0 \quad \text{[EQUATION 3]}$$

$$0.08 < |\beta L3 \times NA| < 0.23 \quad \text{[EQUATION 4]}$$

The satisfactions of Equations 3 and 4 provide proper magnification load distribution between the lens units L1 and L3, maintain the film characteristics of the first and second deflective reflectors FM1 and FM2 and the imaging performance, and provide an optical system having a smaller effective diameter and excellent imaging performance.

Preferably, the projection optical system 100 satisfies Equation 5 below, where NA is a numerical aperture of the second object 102 at the image side.

$$1.0 < NA < 1.8 \quad \text{[EQUATION 5]}$$

If a value is lower than the lower limit in Equation 5, it is difficult to obtain expected resolution when the catadioptric projection system 100 is an immersion optical system. On the other hand, if a value exceeds the upper limit in Equation 5, the immersion optical system has an excessively large effective diameter and it becomes difficult to manufacture the lens.

More preferably, the NA of the inventive optical system 100 on the image side satisfies Equation 6 below:

$$1.2 < NA < 1.65 \quad \text{[EQUATION 6]}$$

Preferably, an incident angle Θp of the principal ray upon the first or second deflective reflector FM1 or FM2 satisfies Equation 7, below:

$$20° < \Theta p < 60° \quad \text{[EQUATION 7]}$$

In Equation 7, Θp is an angle between the principal ray of an object point from the lowest object point to the highest object point and a normal to a reflection surface of the first or second deflective reflector FM1 or FM2. If the value becomes lower than the lower limit in Equation 7, the refractive power of a neighboring lens becomes excessively strong, deteriorating the imaging performance. In addition, the neighboring lens becomes excessively large, and it becomes difficult to maintain a space around the deflective reflector. If the value exceeds the upper limit in Equation 7, an incident angle of the light upon the first or second deflective reflector FM1 or FM2 becomes excessively large and it becomes more difficult to design a good film characteristic of the first or second deflective reflector FM1 or FM2. The optical system may be designed to keep the upper limit in Equation 7 to effectively ease the design.

More preferably, the incident angle θp satisfies Equation 8 below:

$$35° < \Theta p < 55° \quad \text{[EQUATION 8]}$$

The projection optical system 100 can correct the positive Petzval sum of the lens units L1 and L3 that do not form a reciprocating optical system by the negative Petzval sum of the catadioptric unit L2 that forms a reciprocating optical system and the lens unit L4 that does not form a reciprocating optical system. Equations 9 and 10 below provide an imaging optical system with a small curvature of field, where P1 is a Petzval sum of the lens unit L1, P2 is a Petzval sum of the catadioptric unit L2, P3 is a Petzval sum of the lens unit L3, and P4 is a Petzval sum of the lens unit 4.

$$P1 > 0, P2 < 0, P3 > 0, P4 < 0 \quad \text{[EQUATION 9]}$$

$$|P1 + P2 + P3 + P4| < 0.1 \quad \text{[EQUATION 10]}$$

When Equation 9 11 is not met, for example, when the Petzval sum of the catadioptric group L2 is zero or positive, it is difficult to sufficiently correct the Petzval sum by using the concave mirror M, and restrain the enlargement of effective diameter in the projection optical system 100.

When the Petzval sum of the lens unit L1 and/or L3 is zero or negative, it is difficult to compose the lens units L1 and L3 only of lenses or even if the lens units L1 and L3 are composed only of lenses, they need many strong negative lenses, increasing the number of lenses in the optical system, and causing increased aberration and cost.

Assume that the concave mirror M is arranged in the lens unit L1 or L3 to make the Petzval sum of the lens units L1 and/or L3 zero or negative. If the concave mirror M is arranged in the lens unit L1, the reflected light from the concave mirror M returns to the vicinity of the first object 101 and the physical interference between the first object 101, the returned light, and a neighboring lens is likely to occur, making the configuration mechanically difficult. On the other hand, if the concave mirror M is arranged in the lens unit L3, this configuration uses the concave mirror M in the final imaging optical system and makes the light separation difficult for an optical system having a high NA.

When the Petzval sum of the lens unit L4 is zero or negative, the correction effect to the distortion etc. reduces, which is one of effects of this embodiment.

When Equation 10 is not met, the curvature of field increases and the imaging performance remarkably deteriorates. However, Equations 9 and 10 do not have to be met for an annular slit shape etc., because the imaging performance maintains at a part of the used image point even on the curved image surface. Equations 9 and 10 do not have to be met for a rectangular slit shape, when the image point is used only partially.

The projection optical system 100 preferably meets Equation 11 below, where Y is a distance between the optical axes AX1 and AX3, ΦL2_max is a maximum effective diameter in the catadioptric unit L2, and ΦL3_max is a maximum effective diameter in the lens unit L3:

$$0.2 < (\Phi L2\_max + \Phi L3\_max)/(2Y) < 0.9 \quad \text{[EQUATION 11]}$$

When the value becomes lower than the lower limit in Equation 11, the distance between the optical axes AX1 and AX3 increases and the apparatus becomes large. On the other hand, when the value exceeds the upper value in Equation 11, the distance between the optical axes AX1 and AX3 is so close that the lens in the catadioptric unit L2, the concave mirror M, and the lens in the lens unit L3 interfere or it becomes difficult to configure the barrel.

Preferably, Equation 12 below is met, where ΦM is an effective diameter of the concave mirror M, and hM is a height of the most off-axial principal ray from the optical axis AX2 in the concave mirror M:

$$|hM/\Phi M|<0.10 \qquad \text{[EQUATION 12]}$$

If Equation 12 is not met, the concave mirror M goes apart from the pupil and it becomes difficult to restrain astigmatism etc. that is hard to correct.

The first and second deflective reflectors FM1 and FM2 include, for example, a deflective mirror that may have a flat shape or another shape. The first and second deflective reflectors FM1 and FM2 may be mirrors using a reflection on a rear surface of the glass.

Preferably, an aperture stop (not shown) may be arranged in the lens unit L3. However, the aperture stop may be arranged in the lens unit L1 or near the concave mirror M in the lens unit L2. Plural aperture stops may be arranged.

Preferably, the projection optical system 100 is configured to be approximately telecentric at least on the image-surface side to maintain the magnification when the surface of the second object 102 fluctuates in the optical-axis direction. More preferably, the projection optical system 100 is configured to be approximately telecentric also on the object-surface side.

The projection optical system 100 may include a correction mechanism for correcting the aberration. The correction mechanism may, for example, serve to move a lens in the lens unit L1 in the optical-axis direction and/or in a direction perpendicular to the optical axis or in other directions, and to decenter the lens. The catadioptric group L2 and lens units L3 and L4 may have a similar correction mechanism. A mechanism that deforms the concave mirror M and correct the aberration may be provided, and a mechanism that deforms the first and second deflective reflectors FM1 and FM2 and correct the aberration may be provided.

While the projection optical system 100 is an immersion one that fills the space with the fluid between the second object 102 and its final lens surface in this embodiment, the projection optical system 100 may not be the immersion one and may fill the space with the gas between the second object 102 and its final lens surface. When the space between the second object 102 and the final lens surface of the optical system is filled with the gas, the NA on the image side is smaller than 1.

The projection optical system 100 may arrange a field stop near the first or second intermediate images IMG1 and IMG2. A field stop may also be provided near the surface of the second object 102 or a mechanism that serves as the field stop may be provided to the final lens surface. Use of the immersed second object 102 or a diffractive optical element would effectively prevent flare and ghost in cooperation with a field stop provided to or near the final lens surface of the optical system.

For the immersion optical system, whether or not the diffractive optical element is use, an axial interval between the final lens surface of the optical system and the surface of the second object 102 is preferably 5 mm or smaller to minimize the fluid's influence on the imaging performance of the optical system. This is not true unless the fluid affects the optical performance of the optical system.

The lens unit L4 having a negative refractive power may include a single negative lens or plural negative lenses. As long as the lens unit L4 has a negative power, it may include a positive lens or an optical element that has no refractive power, such as a plane-parallel plate.

The projection optical system 100 is suitable for an exposure apparatus that uses, as exposure light, the light having a short wavelength, preferably a wavelength of 200 nm or smaller, such as the ArF excimer laser and $F_2$ laser, which is required to be combined with the immersion. Especially, the magnification β of the entire system may meet $\frac{1}{10} \leq |\beta| \leq \frac{1}{3}$.

A description will now be given of a specific lens configuration of the projection optical system 100:

First Embodiment

Figure 3:
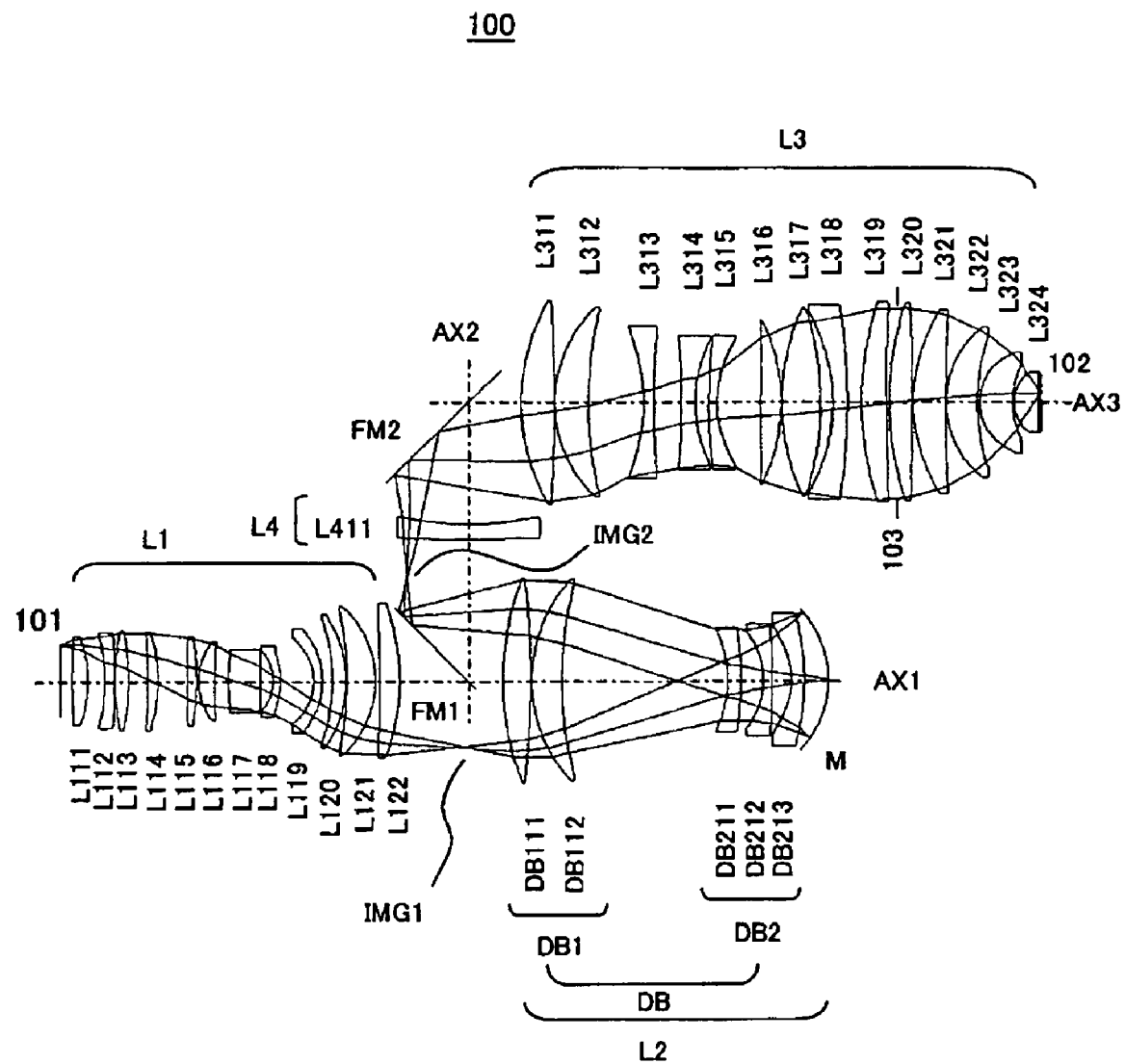
FIG. 3 is an optical-path diagram showing a specific lens structure of the inventive catadioptric projection system.

FIG. 3 is an optical-path diagram showing a specific lens configuration of the projection optical system 100 of the first embodiment. Referring to FIG. 3, the catadioptric projection system 100 includes, in order from the first object 101 side, a first lens unit L1 that does not form a reciprocating optical system, a catadioptric unit L2 that forms a reciprocating optical system, a second lens unit L3 that does not form a reciprocating optical system, and a third lens unit L4 that does not form a reciprocating optical system.

The lens unit L1 includes a dioptric lens unit having at least one lens. The catadioptric unit L2 includes a fourth lens unit DB that forms a reciprocating optical system and a concave mirror M. The lens unit DB includes a fifth lens unit DB1 that has a positive refractive power and includes at least one lens having a positive refractive power, and a sixth lens unit DB2 that has a negative refractive power and includes at least one lens having a positive refractive power. The lens unit L3 is a dioptric unit that includes at least one lens.

The catadioptric projection system 100 includes two deflective reflectors or first and second deflective reflectors FM1 and FM2 between the lens unit L3 and the concave mirror M. More specifically, the first and second deflective reflectors FM1 and FM2 are arranged between the lens unit L3 and catadioptric unit L2. This embodiment arranges the lens unit L4 between the first and second deflective reflectors FM1 and FM2.

The first deflective reflector FM1 deflects the optical axis AX1 to the optical axis AX2 by 90°. The second deflective reflector FM2 deflects the optical axis AX2 to the optical axis AX3 by 90°. As a result, the light is deflected. The first and second deflective reflectors FM1 and FM2 each use a plane mirror in this embodiment.

The first intermediate image IMG1 as a real image of the off-axis light exists between the lens unit L1 that does not form a reciprocating optical system and the lens unit DB1 that forms a reciprocating optical system in this embodiment. The second intermediate image IMG2 as a real image exists between the lens unit DB1 that forms a reciprocating optical system and the lens unit L3 that does not form a reciprocating optical system, more specifically between the first and second deflective reflectors FM1 and FM2.

The lens unit L1 having a positive refractive power includes, along a light traveling direction in order from the first object 101 side, a biconvex positive lens L111, a meniscus aspheric negative lens L112 having a convex surface facing the first object 101, a biconvex positive lens L113, a meniscus positive lens L114 having a convex surface facing the concave mirror M, an approximately planoconvex aspheric positive lens L116 having a convex surface facing the first object 101 side, an approximately planoconvex aspheric positive lens L117 having a convex surface facing the first object 101, an aspheric negative lens L118 having a concave surface facing the first object 101 side, a meniscus negative lens L119 having a concave surface facing the first object 101 side, meniscus positive lenses L120 and L121 having concave surfaces facing the first object 101 side, and an approximately planoconvex aspheric positive lens L122 having a convex surface facing the concave mirror M side.

The lens unit DB1 having a positive refractive power includes, in order from the first object 101 side, and a biconvex positive lens DB111, and a meniscus positive lens DB112 having a concave surface facing the concave mirror M side.

The lens unit DB2 having a negative refractive power includes, in order from the first object 101 side, a meniscus negative lens DB211 having a concave surface facing the first object 101 side, an approximately planoconvex negative lens DB212 having a concave surface facing the first object 101 side, and an meniscus aspheric negative lens DB213 having a concave surface facing the first object 101 side.

The lens unit L4 includes an approximately planoconvex negative lens L411 having a concave surface facing the second deflective reflector FM2 side.

The lens unit L3 includes an approximately planoconvex positive lens L311 having a convex surface facing the second deflective reflector FM2 side, a meniscus positive lens L312 having a concave surface facing the second object 102 side, a biconvex aspheric negative lens L313, an approximately planoconvex aspheric negative lens L314 having a concave surface facing the second object 102 side, a meniscus negative lens L315 having a concave surface facing the second object 102 side; an approximately planoconvex aspheric positive lens L316 having a convex surface facing the second object 102 side, a biconvex positive lens L317, a meniscus negative lens L318 having a concave surface facing the second deflective reflector FM2 side, an approximately planoconvex positive lens L319 having a convex surface facing the second deflective reflector FM2 side, an aperture stop, an approximately planoconvex positive lens L320 having a convex surface facing the second deflective reflector FM2 side, an approximately planoconvex aspheric positive lens L321 having a convex surface facing the second deflective reflector FM2 side, a meniscus aspheric positive lens L322 having a concave surface facing the second object 102 side, and an approximately planoconvex positive lens L324 having a plane surface facing the second object 102 side.

While the aperture stop 103 is arranged, but not limited to, between the positive lenses L319 and L320 in the instant embodiment. For example, the aperture stop 103 may be arranged from the aspheric positive lenses L316 and L322 or near the concave mirror M in the catadioptric unit L2 that forms a reciprocating optical system and/or near a pupil in the lens unit L1 that does not form a reciprocating optical system.

While the lens unit L4 includes one negative lens L411 in this embodiment, the lens unit L4 may include plural lenses. As long as the lens unit L4 has a negative refractive power, the lens unit 4 may include a positive lens.

When the optical axes AX1 and AX3 face the approximately gravity direction, the optical axis AX2 in the lens unit L4 shown in FIGS. 1 and 2 faces a direction different from the gravity direction and the influence of the lens unit L4, such as a self-deformation, decentering, and mechanical pressure by a holding mechanism, is likely to aggregate the imaging performance. Therefore, the lens unit L4 preferably includes a small number of lenses, such as one to five lenses, more preferably, one to three lenses.

The projection optical system 100 of the first embodiment has a projection magnification of ¼ and a reference wavelength of 193 nm, and uses quartz and calcium fluoride as a lens material. An image-side NA is 1.26. An object-to-image distance between the first object 101 surface to the second object 102 surface is about L=1719 mm. The aberration of object point is corrected in a range of about 3.5 mm and 16.5 mm, and an off-axis rectangular exposure area of at least 26 mm long and 6.6 mm wide.

While FIG. 3 shows the light emitting form one off-axis object point, the catadioptric projection system 100 actually uses an off-axis object point range off the optical axis of the first object 101. The exposure area is defined as a rectangular or arc slit area that does not include the optical axis on the first and second objects 101 and 102 surfaces, although a shape of the slit area is not limited.

Figure 4:
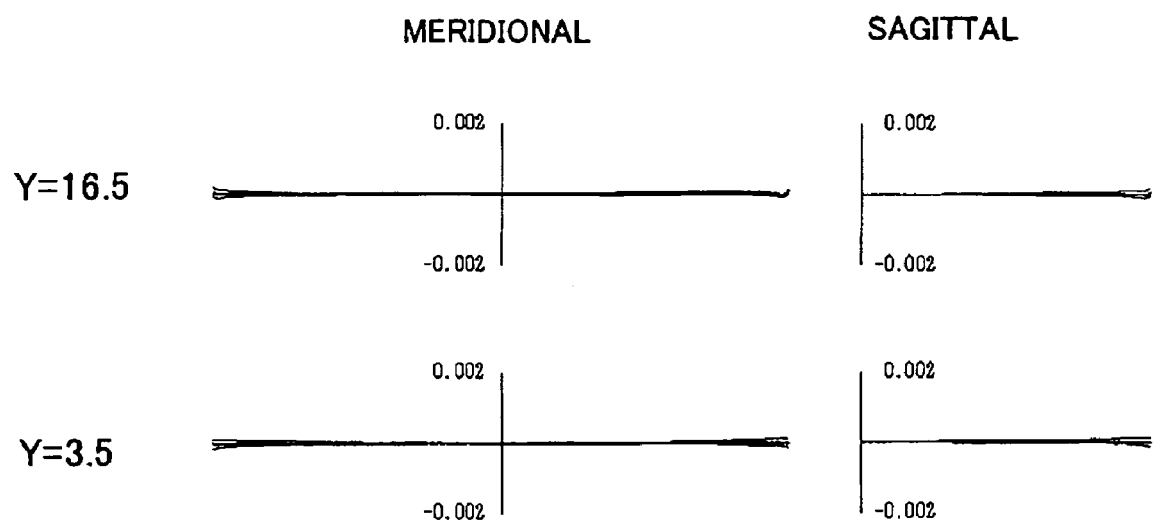
FIG. 4 is an aberrational diagram of the catadioptric projection system shown in FIG. 3.

FIG. 4 shows a lateral aberration diagram of the projection optical system 100 of the first embodiment. FIG. 4 relates to a reference wavelength of 193.0 nm±0.2 pm, and it is understood that monochrome and chromatic aberration are satisfactorily corrected. While this embodiment uses only quartz and calcium fluoride for the glass material, the present invention may use one or more other useable lens materials singularly or in combination.

While the fluid supplied to the space between the final lens surface or the positive lens L324 and the second object 102 is water in this embodiment, its refractive index is not limited. Another liquid may be used as long as it is viable to the projection optical system.

Tables 1 below shows the numerical specification of the projection optical system 100 of the first embodiment, where "i" denotes a surface number along the light traveling direction from the first object 101, "ri" is a radius of curvature of each surface corresponding to a surface number, and "di" is a surface separation between respective surfaces. A lens material $SiO_2$ (quartz) and $CaF_2$ (calcium fluoride), and water as fluid (preferably, pure water) have refractive indexes to a reference wavelength $\lambda$=193.0 nm of 1.5609, 1.5018 and 1.437, respectively. The refractive indexes of the wavelengths of +0.2 pm and −0.2 pm for the reference wavelength are 1.56089968 and 1.56090031 for $SiO_2$, 1.50179980 and 1.5018001 for $CaF_2$, and 1.43699576 and 1.437000424 for water. An aspheric shape is given as $X=(H^2/4)/(1+((1-(1+k)\cdot(H/r)^2))^{1/2})+AH^4+BH^6+CH^8+DH^{10}+EH^{12}+FH^{14}+GH^{16}$, where X is a displacement amount in an optical-axis direction from the lens vertex, H is a distance from the optical axis, ri is a radius of curvature, k is a conical constant, and A, B, C, D, E, F, and G are aspheric coefficients.

TABLE 1

L = 1719.4 mm
β = ¼
NA = 1.26
P1 = 0.00821902
P2 = −0.01765188
P3 = 0.00990997
P4 = −0.00047685
| P1 + P2 + P3 + P4 | = 2.6e − 7
(φ L2 max + φ L3 max)/(2 * Y) = 0.719
θ p = 40.9~44.9
| β L1/β | = 7.05
| β L3 * NA | = 0.21
|hM/φM| = 0.006

DISTANCE FROM FIRST OBJECT TO FIRST SURFACE: 20.74927 mm

| i | ri | di | GLASS MATERIAL |
|---|---|---|---|
| 1 | 985.90954 | 27.68044 | SiO2 |
| 2 | −245.79656 | 30.44828 | |
| 3 | −317.33131 | 16.87929 | SiO2 |
| 4 | −1192.74886 | 1 | |
| 5 | 506.67282 | 22.69424 | SiO2 |
| 6 | −501.90789 | 34.34281 | |
| 7 | −1124.63272 | 17.31693 | SiO2 |
| 8 | −325.56264 | 51.83056 | |
| 9 | 2265.27729 | 18.30564 | SiO2 |
| 10 | −472.53116 | 3.26769 | |
| 11 | 116.62602 | 29.43943 | SiO2 |
| 12 | 1440.23416 | 23.29293 | |
| 13 | 417.71187 | 56.12174 | SiO2 |
| 14 | −2391.94425 | 22.73809 | |
| 15 | −83.37614 | 12.90225 | SiO2 |
| 16 | −131.6906 | 58.54902 | |
| 17 | −98.7373 | 15.00001 | SiO2 |
| 18 | −142.9992 | 17.31442 | |
| 19 | −361.3748 | 23.39504 | SiO2 |
| 20 | −220.50856 | 1.65569 | |
| 21 | −633.20096 | 50.84001 | SiO2 |
| 22 | −179.20621 | 6.3692 | |
| 23 | −3277.98382 | 36.73609 | SiO2 |
| 24 | −360.27402 | 180.54809 | |
| 25 | 497.30374 | 48.39527 | SiO2 |
| 26 | −1698.75418 | 2.60777 | |
| 27 | 270.30497 | 53.24012 | SiO2 |
| 28 | 658.49186 | 292.99061 | |
| 29 | −209.51243 | 23.5333 | SiO2 |
| 30 | −666.68249 | 39.90534 | |
| 31 | −143.17978 | 15.00007 | SiO2 |
| 32 | −2120.57399 | 34.47858 | |
| 33 | −140.63071 | 22.51842 | SiO2 |
| 34 | −468.91983 | 41.55686 | |
| 35 | −190.89729 | −41.55686 | M |
| 36 | −468.91983 | −22.51842 | SiO2 |
| 37 | −140.63071 | −34.47858 | |
| 38 | −2120.57399 | −15.00007 | SiO2 |
| 39 | −143.17978 | −39.90534 | |
| 40 | −666.68249 | −23.5333 | SiO2 |
| 41 | −209.51243 | −292.9906 | |
| 42 | 658.49186 | −53.24012 | SiO2 |
| 43 | 270.30497 | −2.60777 | |
| 44 | −1698.75418 | −48.39527 | SiO2 |
| 45 | 497.30374 | −60.0007 | |
| 46 | 0 | 251.10328 | FM1 |
| 47 | 2944.07174 | 28 | SiO2 |
| 48 | 600 | 219 | |
| 49 | 0 | −92.80013 | FM2 |
| 50 | −377.48242 | −57.86884 | SiO2 |
| 51 | 3330.71395 | −1 | |
| 52 | −237.72498 | −59.99999 | SiO2 |
| 53 | −747.39787 | −97.14496 | |
| 54 | 329.20026 | −17.52258 | SiO2 |
| 55 | −1353.8764 | −48.62241 | |
| 56 | −2375766.187 | −25.01201 | SiO2 |
| 57 | −250.64951 | −24.1215 | |
| 58 | −965.11989 | −15 | SiO2 |
| 59 | −216.00941 | −76.76679 | |
| 60 | −2572.96712 | −36.89217 | SiO2 |

TABLE 1-continued

| | | | |
|---|---|---|---|
| 61 | 335.26799 | −1 | |
| 62 | −412.87297 | −67.85581 | SiO2 |
| 63 | 565.56871 | −20.99257 | |
| 64 | 341.50029 | −25 | SiO2 |
| 65 | 1117.63808 | −24.04529 | |
| 66 | −581.93197 | −43.13346 | SiO2 |
| 67 | −5248.40099 | −17.9974 | |
| 68 | 0 | 13.0808 | APERTURE STOP |
| 69 | −586.89817 | −39.30345 | SiO2 |
| 70 | 3684.64854 | −1 | |
| 71 | −310.14951 | −56.99437 | SiO2 |
| 72 | −3225.96002 | −1 | |
| 73 | −176.49074 | −55.51752 | SiO2 |
| 74 | −436.39145 | −4.08989 | |
| 75 | −96.99904 | −58.61486 | CaF2 |
| 76 | −184.07208 | −1 | |
| 77 | −70.10101 | −41.56479 | CaF2 |
| 78 | 0 | −3.43228 | water | aspherical surfaces

| i | K | A | B | C |
|---|---|---|---|---|
| 4 | 1.046427E+02 | −8.956635E−09 | −4.384414E−13 | 9.556655E−17 |
| 12 | 2.368468E+01 | −1.805519E−07 | 3.763955E−11 | −3.195146E−15 |
| 13 | 3.693830E+01 | −1.951169E−08 | −2.994248E−11 | −1.323798E−15 |
| 16 | −1.399738E+00 | 2.186550E−07 | 2.565274E−11 | −2.866386E−16 |
| 24 | 2.274936E−01 | 8.309651E−09 | 4.484262E−14 | 9.483128E−19 |
| 33 | −4.298840E−01 | 2.001117E−08 | 1.561865E−12 | 6.412682E−17 |
| 37 | −4.298840E−01 | 2.001117E−08 | 1.561865E−12 | 6.412682E−17 |
| 54 | 5.723493E−01 | 1.113981E−08 | −1.680835E−12 | 1.434296E−17 |
| 56 | −3.219264E+09 | 1.947623E−08 | 9.819365E−13 | −4.542727E−18 |
| 59 | 6.174234E−02 | −9.440386E−10 | 1.431433E−13 | 7.985551E−17 |
| 60 | −4.951200E+02 | 7.755947E−09 | −2.695161E−13 | 1.191387E−17 |
| 71 | −8.215106E−02 | 3.509411E−10 | 9.739833E−14 | −1.775867E−18 |
| 74 | 2.071796E+00 | −8.070481E−09 | −1.696831E−13 | −5.471714E−18 |

| i | D | E | F | G |
|---|---|---|---|---|
| 4 | −7.199144E−21 | 1.828038E−24 | −2.219988E−28 | 1.020846E−32 |
| 12 | 6.384876E−19 | −9.822047E−23 | 2.387294E−26 | −2.385055E−30 |
| 13 | 1.067361E−18 | −6.567870E−22 | 1.884112E−25 | −1.884209E−29 |
| 16 | −2.185374E−19 | −5.342342E−23 | 1.633435E−26 | −1.111931E−30 |
| 24 | −2.704677E−23 | 2.597486E−27 | −1.115633E−31 | 2.350073E−36 |
| 33 | 1.946640E−21 | −8.128579E−26 | 3.771169E−30 | −4.517488E−34 |
| 37 | 1.946640E−21 | −8.128579E−26 | 3.771169E−30 | −4.517488E−34 |
| 54 | 2.805630E−21 | −1.574401E−25 | 3.760804E−30 | −3.459776E−35 |
| 56 | −2.619681E−21 | −3.890863E−26 | 6.143364E−30 | −1.365765E−34 |
| 59 | −2.166948E−21 | −9.840221E−26 | 8.521078E−30 | −2.437815E−34 |
| 60 | −6.624923E−23 | 1.896540E−27 | −5.175814E−32 | 1.992208E−36 |
| 71 | 3.251293E−23 | 2.083317E−28 | −6.921360E−33 | 3.004071E−38 |
| 74 | 4.271839E−22 | −3.643008E−26 | 1.528967E−30 | −3.584199E−35 |

Second Embodiment

Figure 5:
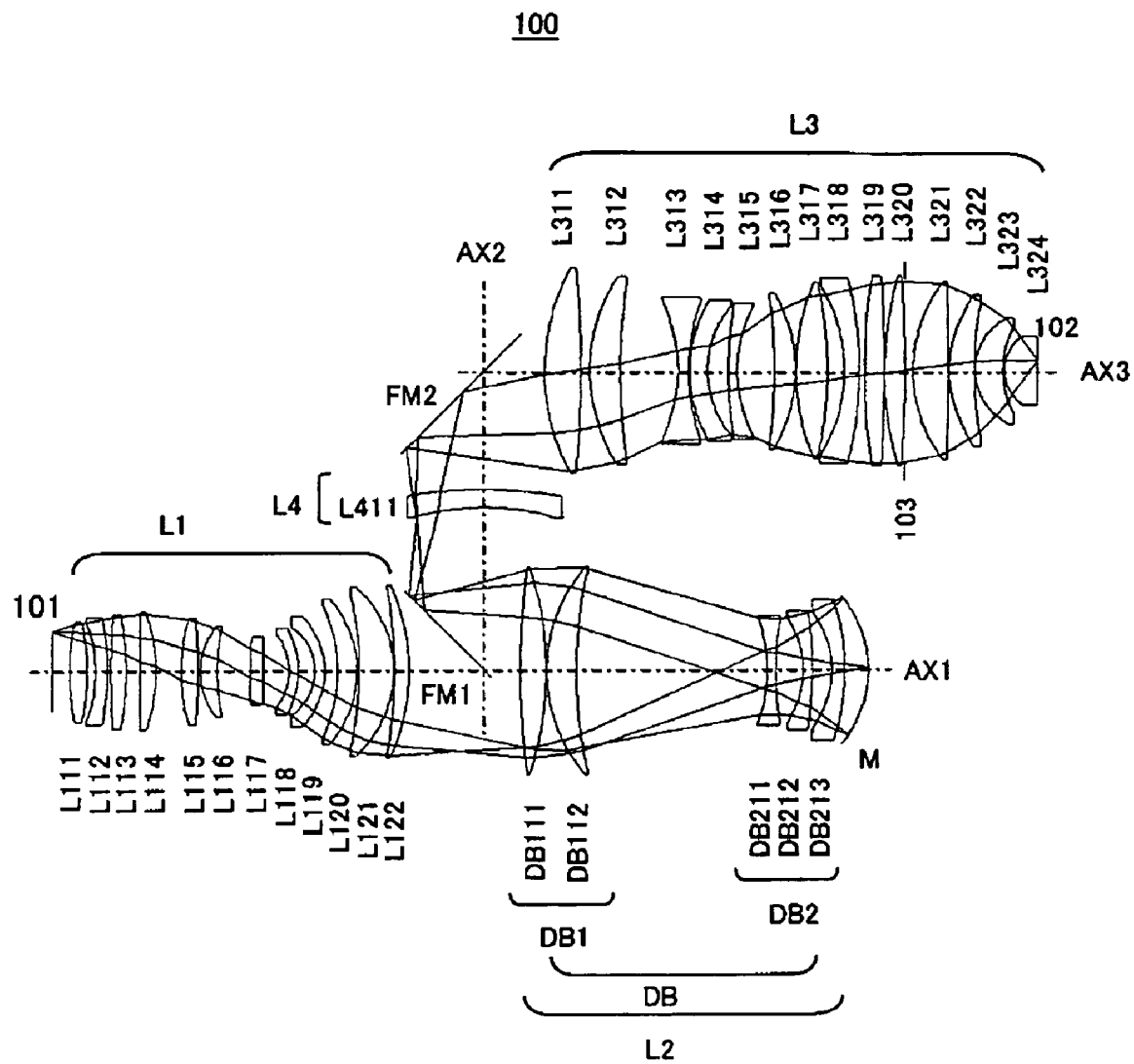
FIG. 5 is an optical-path diagram showing a specific lens structure of the inventive catadioptric projection system.

FIG. 5 is an optical-path diagram showing a specific lens configuration of the projection optical system 100 of the second embodiment. Referring to FIG. 5, the projection optical system 100 includes, in order from the first object 101 side, a first lens unit L1 that does not form a reciprocating optical system, a catadioptric unit L2 that forms a reciprocating optical system, a second lens unit L3 that does not form a reciprocating optical system, and a third lens unit L4 that does not form a reciprocating optical system.

The lens unit L1 includes a dioptric lens unit having at least one lens. The catadioptric unit L2 includes a fourth lens unit DB that forms a reciprocating optical system and a concave mirror M. The lens unit DB includes a fifth lens unit DB1 having a positive refractive power, and a sixth lens unit DB2 having a negative refractive power. The lens unit L3 is a dioptric unit that includes at least one lens.

The first and second deflective reflectors FM1 and FM2 are arranged between the lens unit L3 and catadioptric unit L2. This embodiment arranges the lens unit L4 between the first and second deflective reflectors FM1 and FM2.

The first deflective reflector FM1 deflects the optical axis AX1 to the optical axis AX2 by 90°. The second deflective reflector FM2 deflects the optical axis AX2 to the optical axis AX3 by 90°. As a result, the light is deflected. The first and second deflective reflectors FM1 and FM2 each use a plane mirror in this embodiment.

The first intermediate image IMG1 as a real image of the off-axis light exists between the lens unit L1 that does not form a reciprocating optical system and the lens unit DB2 that forms a reciprocating optical system in this embodiment. The first intermediate image IMG1 may exist in the lens unit DB1 that forms a reciprocating optical system and has a positive refractive power, or between the lens unit DB1 and the lens unit DB2 having a negative refractive power. The second intermediate image IMG2 as a real image exists between the lens unit DB1 that forms a reciprocating optical system and the lens unit L3 that does not form a reciprocating optical system.

The lens unit L1 having a positive refractive power includes, along a light traveling direction in order from the first object 101 side, a biconvex positive lens L111, a meniscus aspheric negative lens L112 having a convex surface facing the first object 101, approximately planoconvex positive lenses L113 and L114 having convex surfaces facing the concave mirror M side, a biconvex positive lens L115, a meniscus aspheric positive lens L116 having a convex surface facing the first object 101 side, an approximately planoconvex aspheric positive lens L117 having a convex surface facing the first object 101 side, a meniscus aspheric negative lens L118 having a concave surface facing the first object 101 side, a meniscus aspheric negative lens L119 having a concave surface facing the first object 101 side, meniscus positive lenses L120 and L121 having concave surfaces facing the first object 101 side, and a meniscus aspheric positive lens L121 having a convex surface facing the concave mirror M side.

The lens unit DB1 that forms a reciprocating optical system and has a positive refractive power includes, in order from the first object 101 side, and a biconvex positive lens DB111, and a meniscus positive lens DB112 having a concave surface facing the concave mirror M side.

The lens unit DB2 that forms a reciprocating optical system and has a negative refractive power includes, in order from the first object 101 side, a biconvex lens DB 211, a meniscus negative lens DB212 having a concave surface facing the first object 101 side, and a meniscus aspheric negative lens DB213 having a concave surface facing the first object 101 side.

The lens unit L4 that does not form a reciprocating optical system includes a meniscus negative lens L411 having a concave surface facing the first deflective reflector FM1 side.

The lens unit L3 includes a biconvex positive lens L311, a meniscus positive lens L312 having a convex surface facing the second deflective reflector FM2 side, a biconvex aspheric negative lens L313, meniscus negative lenses L314 and L315 having concave surfaces facing the second object 102 side, a meniscus aspheric positive lens L316 having a convex surface facing the second object 102 side, a biconvex positive lens L317, a meniscus negative lens L318 having a concave surfaces facing the second deflective reflector FM2 side, an approximately planoconvex positive lens L319 having a convex surface facing the second deflective reflector FM2 side, an approximately planoconvex aspheric positive lens L320 having a convex surface facing the second deflective reflector FM2 side, an aperture stop 103, an approximately planoconvex aspheric positive lens L321 having a convex surface facing the second deflective reflector FM2 side, meniscus aspheric positive lenses L322 and L323 having convex surfaces facing the second deflective reflector FM2 side, and an approximately planoconvex positive lens L324 having a plane surface facing the second object 102 side.

While the aperture stop 103 is arranged, but not limited to, between the positive lenses L320 and L321 in the instant embodiment.

The projection optical system 100 of the second embodiment has a projection magnification of ¼ and a reference wavelength of 193 nm, and uses quartz as a lens material. An image-side NA is 1.26. An object-to-image distance between the first object 101 surface to the second object 102 surface is about L=1659 mm. The aberration of object point is corrected in a range of about 3.5 mm and 16.75 mm, and an off-axis rectangular exposure area of at least 26 mm long and 7 mm wide. The shape of exposure area is not limited to a rectangle, and may be an arc shape, for example.

Figure 6:
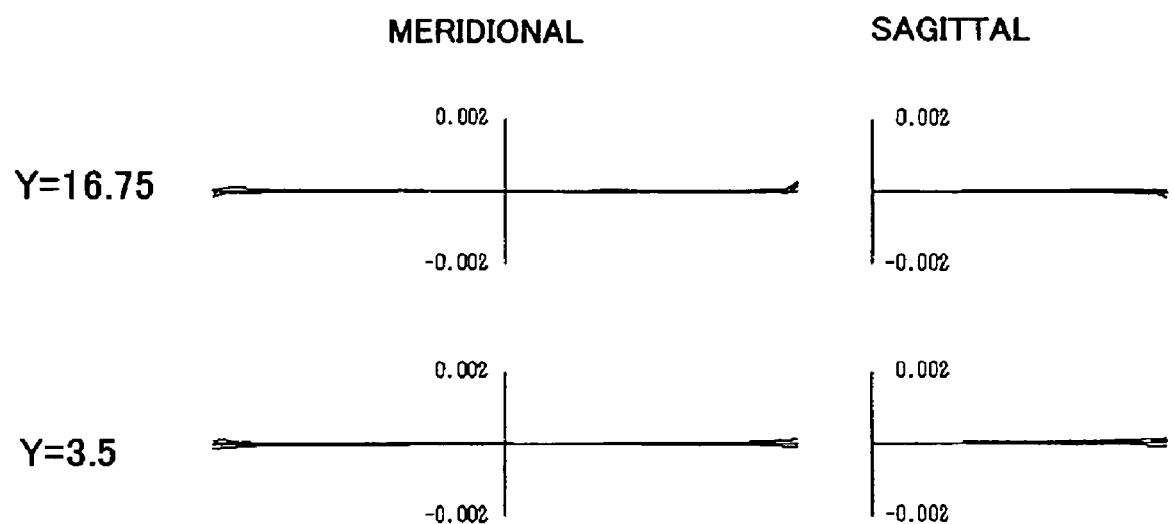
FIG. 6 is an aberrational diagram of the catadioptric projection system shown in FIG. 5.

FIG. 6 shows a lateral aberration diagram of the projection optical system 100 of the second embodiment. FIG. 6 relates to a reference wavelength of 193.0 nm±0.2 pm, and it is understood that monochrome and chromatic aberration are satisfactorily corrected.

While the fluid supplied to the space between the final lens surface or the positive lens L324 and the second object 102 is water in this embodiment, its refractive index is not limited. Another liquid may be used as long as it is viable to the projection optical system.

Tables 2 below shows the numerical specification of the projection optical system 100 of the second embodiment. Each symbol in Table 2 is similarly defined as in Table 1.

TABLE 2

L = 1658.5 mm
β = ¼
NA = 1.26
P1 = 0.00788788
P2 = −0.01787358
P3 = 0.01020948
P4 = −0.00040199
| P1 + P2 + P3 + P4 | = 1.59e − 6e − 7
(φ L2 max + φ L3 max)/(2 * Y) = 0.673
θ p = 39~46.6
| βL1/β | = 8.05
| βL3 * NA | = 0.19
|hM/φ M| = 0.016

| DISTANCE FROM FIRST OBJECT TO FIRST SURFACE: 29.21305 mm | | | |
|---|---|---|---|
| i | ri | di | GLASS MATERIAL |
| 1 | 435.2568 | 28.84566 | SiO2 |
| 2 | −417.13578 | 14.43963 | |
| 3 | −219.36026 | 20.75772 | SiO2 |
| 4 | −344.68952 | 5.4507 | |
| 5 | 1983.20886 | 25.33229 | SiO2 |
| 6 | −486.15054 | 23.7035 | |

TABLE 2-continued

| | | | |
|---|---|---|---|
| 7 | −47942.99288 | 27.27908 | SiO2 |
| 8 | −289.90578 | 42.64498 | |
| 9 | 298.88567 | 28.3616 | SiO2 |
| 10 | −1027.35575 | 3.99374 | |
| 11 | 119.67967 | 28.16761 | SiO2 |
| 12 | 340.40571 | 55.68811 | |
| 13 | 609.05385 | 22.48336 | SiO2 |
| 14 | −1786.0767 | 42.68593 | |
| 15 | −99.82477 | 15.65199 | SiO2 |
| 16 | −132.47018 | 28.06908 | |
| 17 | −87.46193 | 16.67041 | SiO2 |
| 18 | −130.9144 | 20.89811 | |
| 19 | −268.5 | 34.0271 | SiO2 |
| 20 | −179.81992 | 4.16074 | |
| 21 | −532.63295 | 57.70606 | SiO2 |
| 22 | −188.43384 | 1.00954 | |
| 23 | −792.05863 | 25.5105 | SiO2 |
| 24 | −310.87993 | 186.40227 | |
| 25 | 1358.94328 | 42.87971 | SiO2 |
| 26 | −574.84474 | 1 | |
| 27 | 272.83631 | 49.14466 | SiO2 |
| 28 | 789.77858 | 321.41101 | |
| 29 | −255.51447 | 15.002 | SiO2 |
| 30 | 538.13184 | 45.35771 | |
| 31 | −157.75792 | 15.00018 | SiO2 |
| 32 | −739.42204 | 33.96714 | |
| 33 | −145.02408 | 21.29321 | SiO2 |
| 34 | −390.23646 | 40.33923 | |
| 35 | −193.59865 | −40.33923 | M |
| 36 | −390.29646 | −21.29321 | SiO2 |
| 37 | −145.02406 | −33.96714 | |
| 38 | −739.42204 | −15.00018 | SiO2 |
| 39 | −157.75782 | −45.35771 | |
| 40 | 538.13184 | −15.002 | SiO2 |
| 41 | −255.51447 | −321.411 | |
| 42 | 789.77858 | −49.14468 | SiO2 |
| 43 | 272.83831 | −1 | |
| 44 | −574.84474 | −42.87971 | SiO2 |
| 45 | 1358.94328 | −60.00045 | |
| 46 | 0 | 278.19008 | FM1 |
| 47 | −416.0642 | 30.52913 | SiO2 |
| 48 | −778.33724 | 202.28081 | |
| 49 | 0 | −100 | FM2 |
| 50 | −368.65669 | −59.98535 | SiO2 |
| 51 | 1888.94358 | −15.28392 | |
| 52 | −291.64682 | −51.77545 | SiO2 |
| 53 | −1070.55004 | −96.87061 | |
| 54 | 254.51183 | −17.5 | SiO2 |
| 55 | −344.75096 | −1.25298 | |
| 56 | −222.51208 | −30.68277 | SiO2 |
| 57 | −170.48037 | −34.98705 | |
| 58 | −710.5622 | −15 | SiO2 |
| 59 | −227.47244 | −62.50216 | |
| 60 | 1450.11082 | −35.08735 | SiO2 |
| 61 | 270.18391 | −1.21402 | |
| 62 | −377.7231 | −53.6366 | SiO2 |
| 63 | 662.77947 | −28.92474 | |
| 64 | 272.63687 | −25 | SiO2 |
| 65 | 640.8341 | −9.10856 | |
| 66 | −1026.35847 | −31.63029 | SiO2 |
| 67 | 3396.64742 | −1 | |
| 68 | −584.7959 | −34.18439 | SiO2 |
| 69 | 3430.32788 | −0.97625 | |
| 70 | 0 | −12.99979 | APERTURE STOP |
| 71 | −250.07914 | −59.87239 | SiO2 |
| 72 | 6292.53988 | −1.63378 | |
| 73 | −213.9883 | −41.62382 | SiO2 |
| 74 | −572.83288 | −1.28571 | |
| 75 | −99.64355 | −47.55285 | SiO2 |
| 76 | −172.86961 | −2.05363 | |
| 77 | −70.73571 | −55.29554 | SiO2 |
| 78 | 0 | −0.64984 | water |

TABLE 2-continued aspherical surfaces

| i | K | A | B | C |
|---|---|---|---|---|
| 4 | −1.784448E+00 | 2.343646E−08 | −1.248797E−13 | 3.420801E−17 |
| 12 | 7.842263E+00 | −1.305613E−07 | 3.500556E−11 | −2.609853E−15 |
| 13 | 1.021521E+01 | −9.742646E−08 | −2.644387E−12 | −1.570941E−15 |
| 16 | −1.055874E−02 | 1.002230E−07 | 2.932178E−12 | −2.315515E−16 |
| 24 | 1.784139E−01 | 8.887009E−09 | 8.117501E−14 | 1.266942E−18 |
| 33 | −3.468145E−01 | 1.571493E−08 | 1.198210E−12 | 5.225025E−17 |
| 37 | −3.468145E−01 | 1.571483E−08 | 1.198210E−12 | 5.225025E−17 |
| 54 | −2.289477E−02 | 1.532873E−09 | −1.741496E−12 | 6.584767E−17 |
| 56 | 1.033651E−01 | 1.180565E−08 | 7.682772E−14 | −3.534519E−18 |
| 59 | −2.960209E−02 | 3.620485E−09 | −3.803672E−13 | 4.592613E−17 |
| 60 | 3.915197E+01 | 1.188225E−08 | −3.651493E−13 | 9.076921E−18 |
| 68 | 1.990226E−01 | −1.737333E−10 | −2.562622E−15 | 5.595921E−19 |
| 73 | −4.583118E−02 | −3.166979E−09 | 7.426801E−13 | −5.758170E−18 |
| 76 | 3.997199E−01 | −4.853104E−08 | −1.456482E−13 | −2.406510E−18 |

| i | D | E | F | G |
|---|---|---|---|---|
| 4 | −6.373837E−21 | 9.418975E−25 | −8.258683E−29 | 2.878453E−33 |
| 12 | 3.449279E−19 | −5.667335E−23 | 8.172660E−27 | −6.228565E−31 |
| 13 | 8.702506E−19 | −3.604953E−22 | 8.633217E−26 | −1.301539E−29 |
| 16 | 5.193567E−21 | 1.329193E−24 | 7.686436E−28 | −4.225591E−32 |
| 24 | −1.845433E−23 | 1.539232E−27 | −4.611590E−32 | 6.278031E−37 |
| 33 | 2.416034E−21 | −1.000874E−25 | 1.323589E−29 | −7.102881E−34 |
| 37 | 2.416034E−21 | −1.000874E−25 | 1.323589E−29 | −7.102881E−34 |
| 54 | 1.508205E−22 | −1.282763E−25 | 5.725855E−30 | −9.258960E−35 |
| 56 | −1.527047E−21 | 1.979604E−26 | 2.322364E−31 | 3.487479E−35 |
| 59 | 1.392683E−21 | −1.708273E−25 | 5.235044E−30 | −1.180121E−34 |
| 60 | −1.044744E−24 | 2.103350E−26 | −7.611630E−31 | 3.031118E−35 |
| 68 | 8.269422E−24 | −6.263973E−28 | 1.154294E−32 | −8.210563E−38 |
| 73 | 8.461806E−22 | −1.101325E−26 | 8.229423E−31 | −2.140916E−35 |
| 76 | 7.189726E−20 | −9.887113E−24 | 9.843045E−28 | −3.884863E−32 |

The above projection optical systems arrange the reticle surface and the wafer surface in parallel, and provide an optical system having a shortened object-to-image distance without enlarging its size even when the high NA scheme advances. In addition, the above projection optical systems restrain the lens's effective diameter, effectively correct various aberrations, such as astigmatism, and stably achieve excellent imaging performance.

Figure 7:
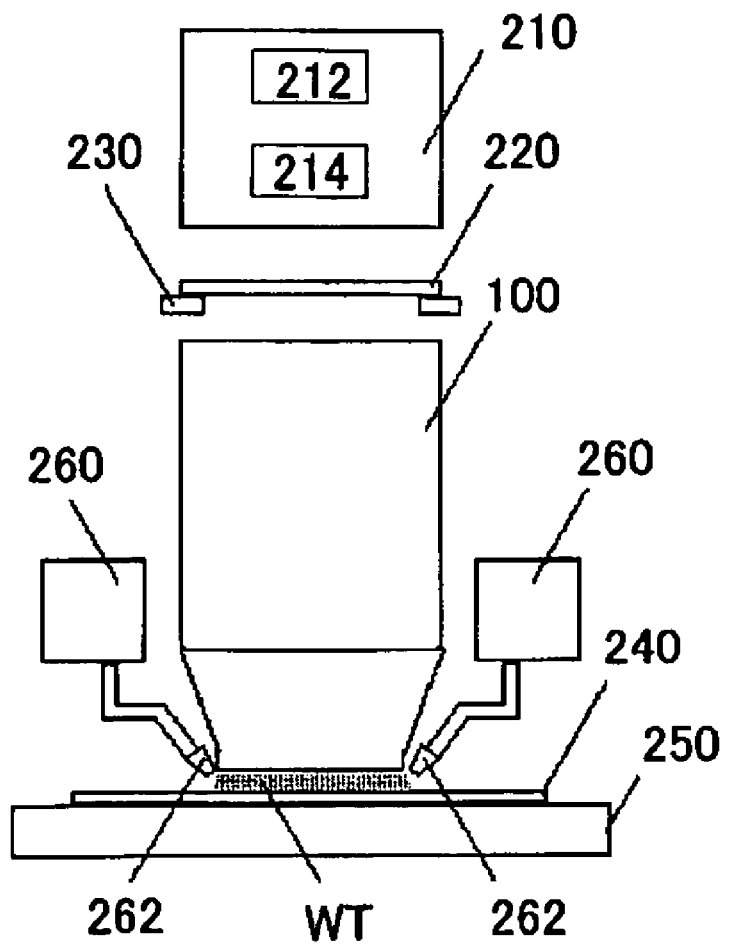
FIG. 7 is a schematic sectional view for explaining a structure of an exposure apparatus according to one aspect of the present invention.

Referring now to FIG. 7, a description will be given of an exposure apparatus 200 that applies the inventive projection optical system 100. FIG. 7 is a schematic sectional view of the exposure apparatus 200 of one aspect according to the present invention.

The exposure apparatus 200 is an immersion exposure apparatus that exposes onto an object 240 a circuit pattern created of a reticle 220 via a fluid WT supplied between a final lens surface at the object 240 side of the projection optical system 100 and the object 240 in a step-and-scan manner. The instant embodiment exemplarily describes a step-and-scan exposure apparatus (which is also called "scanner"). The "step-and-scan manner," as used herein, is an exposure method that exposes a reticle pattern onto a wafer by continuously scanning the wafer relative to the reticle, and by moving, after a shot of exposure, the wafer stepwise to the next exposure area to be shot. The "step-and-repeat manner" is another mode of exposure method that moves a wafer stepwise to an exposure area for the next shot every short of cell projection.

The exposure apparatus 200 includes, as shown in FIG. 7, an illumination apparatus 210, a reticle stage 230 that mounts the reticle 20, the projection optical system 100, a wafer stage 250 that mounts the object 240, a fluid supply/drain mechanism 260, and a controller (not shown). The controller (not shown) is controllably connected to the illumination apparatus 210, the reticle stage 230, the wafer stage 250, and the fluid supply/drain mechanism 260.

The illumination apparatus 210 illuminates the reticle 220 that has a circuit pattern to be transferred, and includes a light source unit 212 and an illumination optical system 214.

The light source unit 212 uses, as an example, a light source such as an ArF excimer laser with a wavelength of approximately 193 nm and a KrF excimer laser with a wavelength of approximately 248 nm. However, the laser type is not limited to excimer lasers, and, for example, an $F_2$ laser with a wavelength of approximately 157 nm may be used. Similarly, the number of laser units is not limited. For example, two independently acting solid lasers would cause no coherence between these solid lasers and significantly reduce speckles resulting from the coherence. An optical system for reducing speckles may swing linearly or rotationally. A light source applicable to the light source unit 212 is not limited to a laser. One or more lamps, such as a mercury lamp and a xenon lamp, may be used.

The illumination optical system 214 is an optical system that illuminates the reticle 220, and includes a lens, a mirror, a light integrator, a stop, and the like. For example, a condenser lens, a fly-eye lens, an aperture stop, a condenser lens, a slit, and an imaging optical system are arranged in this order. The illumination optical system 214 can use any light regardless of whether it is on-axial or off-axial light. The light integrator may include a fly-eye lens or an integrator formed by stacking two sets of cylindrical lens array plates (or lenticular lenses), and be replaced with an optical rod or a diffractive optical element.

The reticle 220 is, for example, a reflection or transmission reticle, and has a circuit pattern to be transferred. It is supported and driven by the reticle stage 230. Diffracted light emitted from the reticle 220 passes the projection optical system 100, and is projected onto the object 240. The reticle 220 and the object 240 are located in an optically conjugate relationship. Since the exposure apparatus 200 of the instant embodiment is a scanner, the reticle 220 and the object 240 are scanned at the speed of the reduction ratio. Thus, the pattern on the reticle 220 is transferred to the object 240. If it is a step-and-repeat exposure apparatus (referred to as a "stepper"), the reticle 220 and the object 240 remain still during exposure.

The reticle stage 230 supports the reticle 220 via a reticle chuck (not shown), and is connected to a moving mechanism (not shown). The moving mechanism includes a linear motor, etc., and moves the reticle 220 by driving the reticle stage 230 in XYZ-axes directions and rotational directions around these directions. The exposure apparatus 200 scans the reticle 220 and the object 240 synchronously under control by the controller (not shown). Here, Y is a scan direction on the reticle 220 or the object 240, X is a direction perpendicular to it, and Z is a perpendicular direction to the surface of reticle 220 or the object 240.

The projection optical system 100 is a catadioptric projection system that projects a reduced size of a pattern on the reticle 220 onto the image surface. The projection optical system 100 can apply any of the above embodiments, and a detailed description thereof will be omitted.

The object 240 is, in the instant embodiment, a wafer, which includes a glass plate for the liquid crystal substrate and other objects. Photoresist is applied to the object 240.

The wafer stage 250 supports the object 240 via a wafer chuck (not shown). The wafer stage 250 moves the object 250 in the XYZ directions and rotational directions around these directions by using a linear motor similar to the reticle stage 230. The positions of the reticle stage 230 and wafer stage 250 are monitored, for example, by a laser interferometer and the like, so that both are driven at a constant speed ratio. The wafer stage 250 is installed on a stage stool supported on the floor and the like, for example, via a dumper, and the reticle stage 230 and the catadioptric projection system 100 are installed on a lens barrel stool (not shown) supported, for example, via a dumper to the base frame placed on the floor.

The fluid supply/drain mechanism 260 supplies, via a supply/drain nozzle 262, the fluid WT between the projection optical system 100 (more specifically, its final lens or optical-element surface closest to the object 240 side) and the object 240, and recovers the supplied fluid WT. In other words, the space between the projection optical system 100 and the surface of the object 240 is filled with the fluid WT supplied from the fluid supply/drain mechanism 260. The fluid WT is, but not limited to, pure water in this embodiment. The fluid WT can be a liquid, such as fluorine system inert liquid, as long as it has a high transmittance and refractive index to a wavelength of the exposure light, and a high chemical stability to the projection optical system 100 and the photoresist on the object 240.

The controller (not shown) includes a CPU and memory (not shown) and controls operation of the exposure apparatus 200. The controller is electrically connected to the illumination apparatus 210, the moving mechanism (not shown) for the reticle stage 230, the moving mechanism (not shown) for the wafer stage 250, and the fluid supply/drain mechanism 260. The controller controls switching among supply, recovery and stop of the fluid WT, and supply/drain amounts of the fluid WT based on a condition such as a drive direction of the wafer stage 250 during the exposure. The CPU includes a processor regardless of its name, such as an MPU, and controls each module. The memory includes a ROM and RAM, and stores a firmware for controlling the operations of the exposure apparatus 200.

In exposure, the light emitted from the light source unit 212, e.g., Koehler-illuminated the reticle 220 via the illumination optical system 214. The light that passes through the reticle 220 and reflects the reticle pattern is imaged onto the object 240 by the projection optical system 100 and the fluid WT. The projection optical system 100 used for the exposure apparatus 200 has a superior imaging performance, and provides devices, such as semiconductor chips, such as LSIs and VLSIs, CCDs, LCDs, magnetic sensors, and thin film magnetic heads, with a high throughput and economic efficiency.

Figure 8:
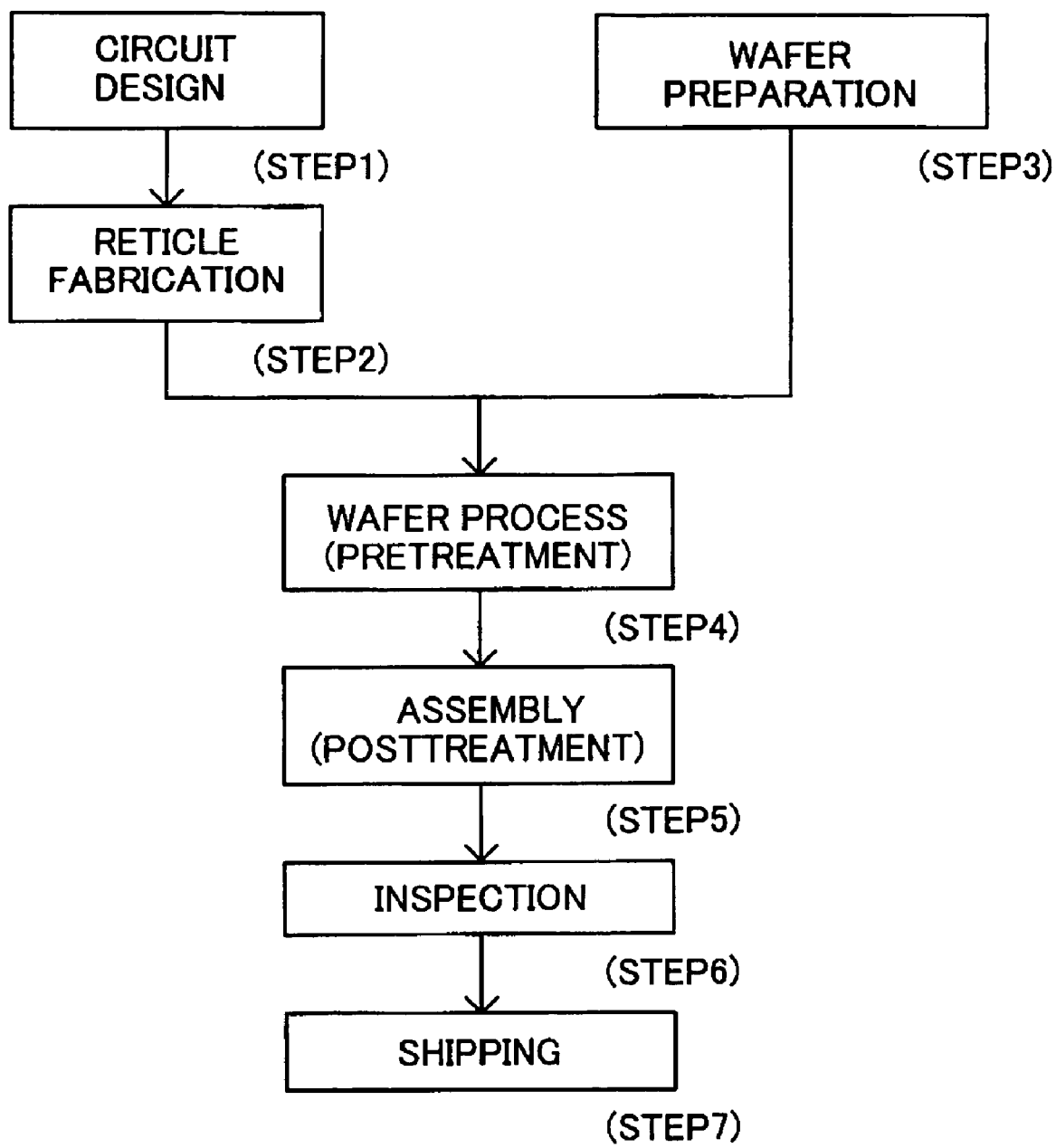
FIG. 8 is a flowchart for explaining how to fabricate devices (such as semiconductor chips such as ICs, LCDs, CCDs, and the like)
Figure 9:
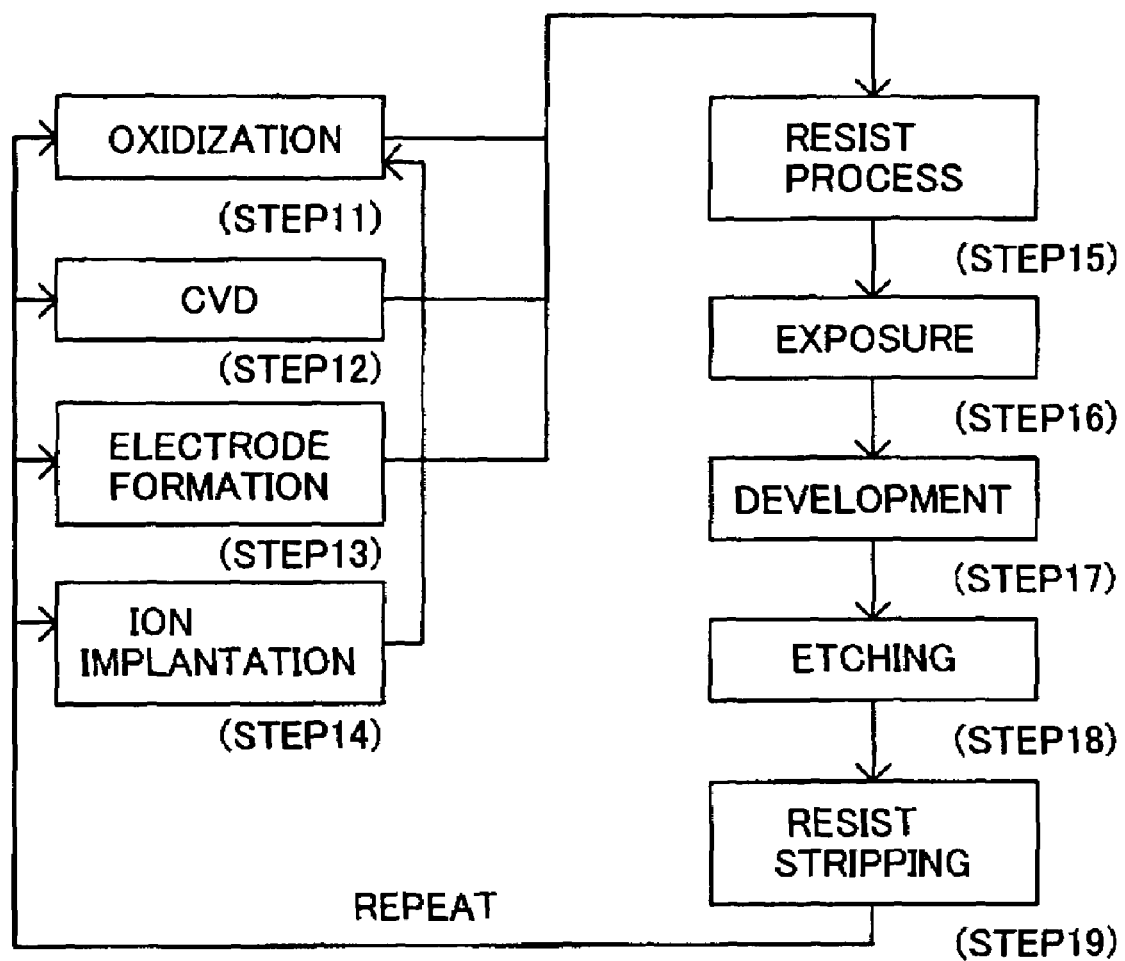
FIG. 9 is a detail flowchart of a wafer process in Step 4 of FIG. 8.

Referring now to FIGS. 8 and 9, a description will be given of an embodiment of a device fabrication method using the above mentioned exposure apparatus 200. FIG. 8 is a flowchart for explaining the manufacture of devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the reticle and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than the conventional one. Thus, the device manufacturing method using the exposure apparatus 200, and resultant devices constitute one aspect of the present invention.

Furthermore, the present invention is not limited to these preferred embodiments and various variations and modifications may be made without departing from the scope of the present invention. For example, the inventive catadioptric projection system is applicable to a non-immersion exposure apparatus. In addition, the inventive catadioptric projection system is not limited to a three-time imaging system, but may be applied to a four-time or more imaging system.

This application claims a foreign priority benefit based on Japanese Patent Application No. 2004-326615, filed on Nov. 10, 2004, which is hereby incorporated by reference herein in its entirety as if fully set forth herein.

What is claimed is:

1. A catadioptric projection system for forming an intermediate image of a first object plural times, and images the intermediate image onto a second object, said catadioptric projection system comprising:
   two deflective reflectors;
   a lens unit arranged in an optical path between said two deflective reflectors, said lens unit having a negative refractive power,
   wherein only said lens unit having negative refractive power is arranged between said two deflective reflectors, and
   light reflected by one of said two deflective reflectors is reflected by another deflective reflector after having passed through said lens unit only once.

2. A catadioptric projection system according to claim 1, further comprising at least one concave mirror that opposes to the first object.

3. A catadioptric projection system that serves as a three-time imaging system for forming an intermediate image of a first object plural times, and images the intermediate image onto a second object, said catadioptric projection system comprising, in order from the first object side:
   a first lens unit configured to direct light from the first object to a first intermediate image;
   a catadioptric unit configured to direct light from the first intermediate image to a second intermediate image;
   a second lens unit configured to direct light from the second intermediate image to the second object;
   two deflective reflectors arranged in an optical path between said catadioptric unit and said second lens unit; and
   a third lens unit arranged in an optical path between said two deflective reflectors, said third lens unit having a negative refractive power,
   wherein said catadioptric unit includes a concave mirror and a fourth lens unit that passes light from the first intermediate image and light reflected by the concave mirror, and
   light reflected by one of said two deflective reflectors is reflected by another deflective reflector after having passed through said third lens unit only once.

4. A catadioptric projection system according to claim 3, wherein the fourth lens unit includes, in order from the first object side, a fifth lens unit having a positive refractive power, and a sixth lens unit having a negative refractive power.

5. A catadioptric projection system according to claim 3, wherein $4.0<|\beta L1/\beta|<24.0$ is met, where $\beta L3$ is a ratio between a paraxial magnification of the first lens unit, and $\beta$ is a paraxial magnification $\beta$ of an overall system.

6. A catadioptric projection system according to claim 3, wherein $0.05<|\beta L3 \times NA|<0.25$ is met, where $\beta L3$ is a ratio between a paraxial magnification of the third lens unit, and NA is a numerical aperture on a second object side.

7. A catadioptric projection system according to claim 3, wherein normals of the first and second deflective reflectors form an angle of substantially 90°.

8. A catadioptric projection system according to claim 3, wherein the first and second objects are arranged in parallel.

9. A catadioptric projection system according to claim 3, wherein the second intermediate image is formed between said two deflective reflectors.

10. An exposure apparatus comprising:
    a catadioptric projection system according to claim 1;
    a reticle stage for holding a reticle so as to position a pattern of the reticle on the first object;
    a wafer stage for holding an object so as to position a photosensitive layer on the second object; and
    a scan unit that synchronously scans the reticle stage and the wafer stage while the reticle is illuminated.

11. An exposure apparatus comprising:
    an illumination optical system for illuminating a pattern with light from a light source; and
    a catadioptric projection system according to claim 1 for projecting the light from the pattern onto an object.

12. An exposure apparatus according to claim 10, wherein fluid is at least partially filled in a space between the second object and a lens surface of the catadioptric optical system closest to the second object.

13. A device manufacturing method comprising the steps of:
    exposing an object to be exposed using an exposure apparatus according to claim 10; and
    developing the object exposed.

* * * * *

UNITED STATES PATENT AND TRADEMARK OFFICE
CERTIFICATE OF CORRECTION

PATENT NO. : 7,268,952 B2
APPLICATION NO. : 11/271665
DATED : September 11, 2007
INVENTOR(S) : Takashi Kato et al.

It is certified that error appears in the above-identified patent and that said Letters Patent is hereby corrected as shown below:

Column 6, Line 55, change "$4.0<|\beta L1/\oplus|<24.0$" to --$4.0<|\beta L1/\beta|<24.0$--.

Column 26, Line 5, change "$\beta L3$" to --$\beta L1$--.

Signed and Sealed this

Eighteenth Day of March, 2008

JON W. DUDAS
*Director of the United States Patent and Trademark Office*